United States Patent
Lin et al.

(10) Patent No.: US 11,430,923 B2
(45) Date of Patent: Aug. 30, 2022

(54) MICRO LIGHT EMITTING DIODE ARRAY AND MANUFACTURING METHOD THEREOF

(71) Applicant: National Taiwan University, Taipei (TW)

(72) Inventors: Ching-Fuh Lin, Taipei (TW); Chun-Yu Lin, Taipei (TW); Yi-Shan Lin, Taipei (TW); Jung-Kuan Huang, Taipei (TW)

(73) Assignee: National Taiwan University, Taipei (TW)

( * ) Notice: Subject to any disclaimer, the term of this patent is extended or adjusted under 35 U.S.C. 154(b) by 96 days.

(21) Appl. No.: 16/736,286

(22) Filed: Jan. 7, 2020

(65) Prior Publication Data

US 2021/0043808 A1 Feb. 11, 2021

(30) Foreign Application Priority Data

Aug. 6, 2019 (TW) .................................. 108127903

(51) Int. Cl.
*H01L 33/00* (2010.01)
*H01L 33/50* (2010.01)

(52) U.S. Cl.
CPC ........ *H01L 33/504* (2013.01); *H01L 33/0095* (2013.01); *H01L 2933/0041* (2013.01)

(58) Field of Classification Search
CPC ............................................... H01L 2933/0041
USPC ............................................................ 438/29
See application file for complete search history.

(56) References Cited

U.S. PATENT DOCUMENTS

| 10,002,795 | B1 * | 6/2018 | Bi ........................ H01L 27/1203 |
| 2019/0243135 | A1 * | 8/2019 | Lin ..................... G02B 27/0101 |
| 2019/0392751 | A1 * | 12/2019 | Hsieh ....................... H01L 33/38 |
| 2020/0395403 | A1 * | 12/2020 | Ahmed ................... H01L 33/22 |

* cited by examiner

*Primary Examiner* — Hsin Yi Hsieh
(74) *Attorney, Agent, or Firm* — Donald E. Stout; Stout, Uxa & Buyan, LLP

(57) ABSTRACT

An embodiment of the present invention provides a micro light emitting diode (LED) array and its manufacturing method. The micro-LED includes a substrate, an epitaxial layer formed on the substrate, and a conversion film formed on the epitaxial layer. Pixels can be defined through lithography, and the pixel size can be very small. This method is characterized in that a mass transfer is not required.

7 Claims, 5 Drawing Sheets

MICRO LIGHT EMITTING DIODE ARRAY AND MANUFACTURING METHOD THEREOF

CROSS-REFERENCE TO RELATED APPLICATIONS

The entire contents of Taiwan Patent Application No. 108127903, filed on Aug. 6, 2019, from which this application claims priority, are expressly incorporated herein by reference.

BACKGROUND OF THE INVENTION

1. Field of the Invention

The present invention relates to a micro light-emitting diode array and its manufacturing method.

2. Description of Related Art

Micro light-emitting diode (microLED), also known as "mLED" or "µLED," is an emerging flat-panel display technology. A micro light-emitting diode display is composed of an array of micro light-emitting diodes forming individual pixels. Compared to widely used liquid crystal display (LCD), micro light-emitting diode displays provide higher contrast, faster response time, and better energy efficiency.

Organic light-emitting diodes (OLEDs) and micro light-emitting diodes can greatly reduce energy consumption compared to conventional LCD systems. Unlike OLEDs, microlight-emitting diodes are based on conventional gallium nitride (GaN) light-emitting diode technology, which provides much higher total brightness, up to 30 times, and higher efficiency (lux/W) than OLEDs.

Generally, the dimension of a LED die is between 200 and 300 micrometers (µm), the dimension of a mini light-emitting diode die is about between 50 and 100 micrometers, and the dimension of a micro-light emitting diode die is about 15 microns.

In the manufacturing process of a micro light-emitting diode display, an epitaxial layer having a thickness of about 4-5 µm must be lifted off by a physical or chemical manner and then transferred onto a circuit substrate. At present, the most significant challenge of manufacturing µLED is finding ways to place a huge amount of micron-level epitaxial layers on a target substrate or circuit through a high-precision device, and this is known as "mass transfer."

Taking a 4K television as an example, the number of epitaxial dies that need to be transferred is as high as 24 million. Even if it can be transferred 10,000 dies per time, it needs to be repeated 2,400 times. The yield and efficiency of massive transfers are highly technically difficult, so the field is actively researching breakthroughs.

SUMMARY OF THE INVENTION

An object of this invention is to provide a micro light-emitting diode array and its manufacturing method.

According to an embodiment of this invention, a micro light emitting diode array is provided with a substrate, a plurality of epitaxial layers, a plurality of first conversion films, and a plurality of second conversion films. The epitaxial layers are disposed on the substrate for emitting a first light having a first color. The first conversion films are respectively formed on a plurality of first upper surfaces of the plurality of epitaxial layers. The second conversion films are respectively formed on a plurality of second upper surfaces of the plurality of epitaxial layers. Wherein, each of the first conversion film and each of the second conversion film comprise one or more light-emitting materials and a host. Each light-emitting material absorbs the first light and then re-emitting another light with a color different from the first color. The host eliminates grain boundaries and light scattering of the one or more light-emitting materials after the first conversion films or the second conversion films are formed.

According to another embodiment of this invention, a method of manufacturing a micro light emitting diode array comprises the steps of: providing a substrate; forming a plurality of epitaxial layers on a surface of the substrate, each of the epitaxial layers emitting a light of a first color; forming a plurality of first conversion films on a plurality of first upper surfaces of the epitaxial layers; forming a plurality of second conversion films on the plurality of second upper surfaces of the epitaxial layers; wherein the steps for forming the plurality of first conversion films and the plurality of second conversion films comprises: dissolving one or more organic dyes and a host in a solvent to prepare a light-emitting solution; forming the light-emitting solution on the first upper surfaces or the second upper surfaces; removing the solvent from the light-emitting solution to form the first conversion films or the second conversion films; wherein each organic dye absorbs the light of the first color and then re-emits a light of a second color or a light of a third color, and the host eliminates grain boundaries and light scattering of the one or more organic dyes form the first conversion films or the second conversion films are formed.

The present invention overcomes the problem of massive transfer of micro LED arrays in conventional manufacturing processes. In the conventional manufacturing process, the dies may be damaged during the transfer process, and the alignment must be accurate during transferring to the target positions. If the transfer yield is not close to 100%, dark spots or defects will appear on the display, which will render the entire display panel fail.

The conversion films of the present invention are continuous films without grain boundaries. In contrast, conventional quantum dot fluorescent films can clearly observe uneven coating and grain boundaries, which cause the problem of internal absorption loss and light dispersion after the fluorescent materials are excited by the (blue) light, leading to overall low illumination efficiency. The micro light emitting diode array and the method for manufacturing the same according to the present invention eliminate the mass transfer. The method greatly improves the yield and saves a lot of time. In addition, the conversion films of the present invention can be patterned with conventional lithography to define pixels with a size equal to or less than 10 µm. Further, the µLEDs produced by the present invention are more advantageous than OLEDs in brightness, driving power, and PPI (pixels per inch).

DETAILED DESCRIPTION OF THE PREFERRED EMBODIMENT

Reference will now be made in detail to those specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in detail, it is appreciated that the quantity of the disclosed components may be greater or less than that disclosed, except where expressly restricting the amount of the components. Wherever possible, the same or similar reference numbers are used in drawings and the description to refer to the same or like parts.

FIGS. 1A to 1F are schematic views showing a method of fabricating a micro light emitting diode array according to an embodiment of the present invention.

Figure 1A:
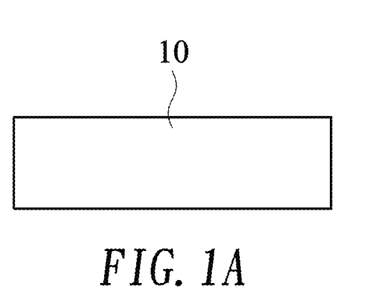
FIGS. 1A to 1F are schematic views showing a method of fabricating a micro light emitting diode array according to an embodiment of the present invention.

Referring to FIG. 1A, a substrate 10 is provided. The substrate 10 may include, but is not limited to, a sapphire substrate, a glass substrate, a silicon substrate, a silicon carbide substrate, a plastic substrate, or other semiconductor substrates. The substrate 10 is cleaned using normal procedures well known in the art.

Figure 1B:
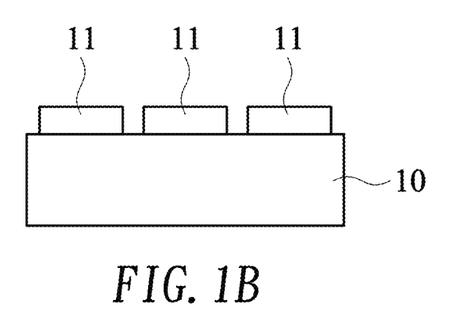

Referring to FIG. 1B, a plurality of epitaxial layers 11 are formed on the upper surface of the substrate 10 by employing an epitaxial process, e.g., a metal organic chemical vapor deposition (MOCVD) method. By using a mask (not shown), these epitaxial layers 11 can be formed on the substrate 1 at positions where the pixels are formed. The epitaxial layers 11 can emit light of a first color.

Figure 1C:
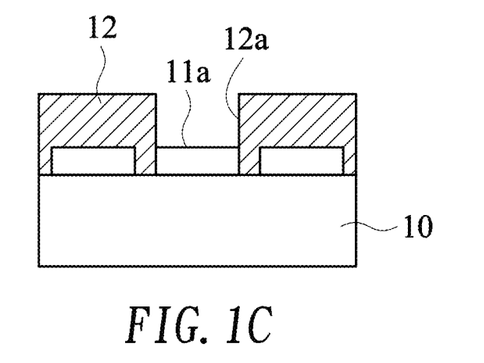

Referring to FIG. 1C, a first mask 12 defining a plurality of openings 12a is formed or disposed on the epitaxial layer 11 to selectively expose the first upper surfaces 11a of the epitaxial layers 11. The first mask 8 may be a patterned photoresist layer, or may be composed of other materials such as silicon dioxide or the like. Taking a patterned photoresist layer as an example, it can be formed using a procedure known in the art such as photolithography or electron-beam lithography. For example, a photoresist layer is first coated on the epitaxial layers 11, and a pattern is transferred to the photoresist layer by performing an exposure with a suitable light source, thereby defining the openings 12a.

In one embodiment, a photoresist S1813 is coated on the epitaxial layer 11, followed by soft bake at 115° C. for 3 minutes. Next, the photoresist is exposed for 18 seconds. Next, the substrate 10 is immersed in the developer MF-319 for 12 seconds, and then immersed in deionized water for 3 to 5 seconds. Next, the substrate 10 is hard baked at 125° C. for 1 minute after it is dried. Next, the openings 12a are formed by reactive-ion etching with the RF power setting to 100 W and dry etching the photoresist using $O^2$ gas.

Figure 1D:
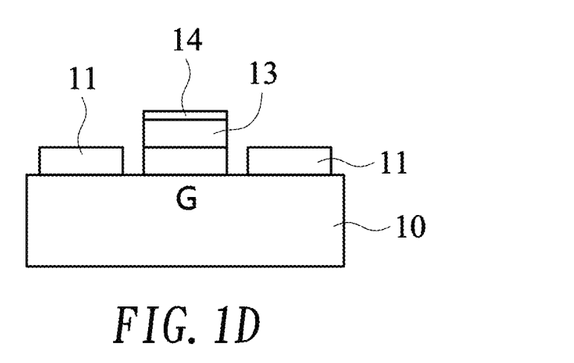

Referring to FIG. 1D, a first conversion film 13 is formed on each first upper surface 11a of the epitaxial layers 11. If the first mask 12 is a photoresist, a protective layer 14 may be formed on the first conversion film 13 after the first conversion film 13 is formed. The protective layer 14 may be silicon oxide and may be deposited using an electron gun (E-gun) evaporation system. Next, the first mask 12 is removed or stripped using reactive ion etching.

Figure 1E:
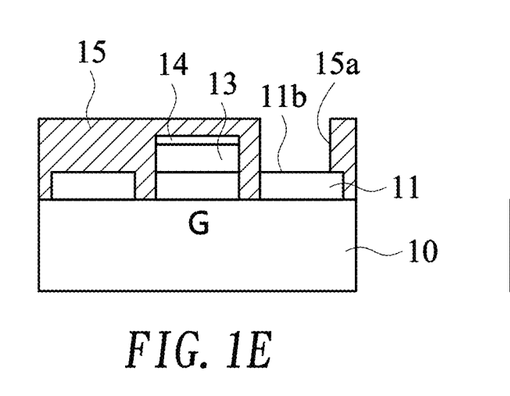

Referring to FIG. 1E, a second mask 15 defining a plurality of openings 15a is formed or disposed on the epitaxial layer 11 to selectively expose the second upper surfaces 11b of the epitaxial layers 11. The second mask 15 may be a patterned photoresist layer, or may be composed of other materials such as silicon oxide or the like. Taking the patterned photoresist layer 15 as an example, it can be formed using a technique known in the art such as optical lithography or electron beam lithography. For example, a photoresist layer is first coated on the epitaxial layer 11, and a pattern is transferred to the photoresist layer by performing an exposure with a suitable light source, thereby defining the openings 15a.

In one embodiment, a photoresist S1813 is coated on the epitaxial layer 11, followed by soft bake at 115° C. for 3 minutes. Next, the photoresist is exposed for 18 seconds. Next, the substrate 10 is immersed in the developer MF-319 for 12 seconds, and then immersed in deionized water for 3 to 5 seconds. Next, the substrate 10 is hard baked at 125° C. for 1 minute after it is dried. Next, the openings 15a are formed by reactive-ion etching with the RF power setting to 100 W and dry etching the photoresist using $O^2$ gas.

Figure 1F:
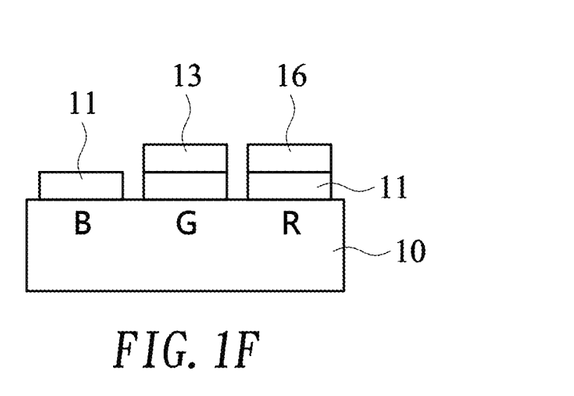

Referring to FIG. 1F, a second conversion film 16 is formed on each second upper surface 11b of the epitaxial layers 11. Next, the second mask 15 is removed or stripped using reactive ion etching.

The conversion films provided by the present invention, such as the first conversion film 13 and the second conversion film 16, are films at least composed of one or more light-emitting materials and a host. Preferably, the conversion films are produced by a solution method. Both the one or more light-emitting materials and the host are dissolved in a solvent to form a light-emitting solution, which is then formed on the needed positions, such as the first upper surface 11a or the second upper surface 11b.

After that, a first conversion film 13 is formed on the first upper surface 11a by removing (e.g., drying) the solvent from the light-emitting solution. Or, a second conversion film 16 is formed on the second upper surface 11b by removing (e.g., drying) the solvent from the light-emitting solution. In particular, the host is used to keeps the optical performance of light-emitting materials in the conversion film as it in the liquid form. In addition, the host can eliminate grain boundaries and light scattering of the light-emitting materials after the conversion film is formed. According to embodiments of this invention, the light-emitting materials are photoluminescent materials which absorb a light with a first color and re-radiate a light with a second color. Preferably, the light-emitting materials are organic dyes comprising non-rare earth elements. In one embodiment, the host keeps the polarity of the organic dyes and hence keeps absorption and radiation wavelength range as it in the liquid form.

In one embodiment, the host comprises a liquid form of silicon dioxide. In one embodiment, the host comprises a polymer having a good film-forming and cladding properties. In one embodiment, the polymer comprises polyvinylpyrrolidone (PVP), epoxy, polymethylmethacrylate (PMMA), or polydimethylsiloxane (PDMS). In one embodiment, the solvent comprises ethanol, chloroform, dichloromethane, or other solvents capable of dissolving the one or more organic dyes and the polymer. In one embodiment, the weight ratio of the organic dyes to the polymer ranges between 1:200 and 1:20000. In one embodiment, method for forming the light-emitting solution on a needed position (such as the first upper surface 11a and the second upper surface 11b) may comprise, but is not limited to, spin coating, dip coating, ink jet printing, screen printing, comma coating, or roll coating. In one embodiment, the light-emitting solution is formed on a needed position by spin coating and the coating time is between 10 sec and 3 min. Next, the solvent is removed from the light-emitting solution so as to form a conversion film, e.g., the first conversion film 13 or the second conversion film 16. In one embodiment, the solvent can be removed from the light-emitting solution by natural (air) seasoning or other manners. The first conversion film 13 or the second conversion film 16 is formed once the solvent is removed.

In the embodiment shown in FIGS. 1A-1F, the epitaxial layers 11 can emit a blue light, and the first conversion films 13 absorb the blue light emitted from the epitaxial layers 11 and then emit a green light. In addition, the second conversion films 16 absorb the blue light emitted from the epitaxial layers 11 and then emit a red light. Embodiments of the invention are not limited thereto and may have other arrangements.

An embodiment of preparing the first conversion film 13 is exemplified below.

Firstly, an organic dye, C545T, is dissolved with a proper solvent, e.g., ethanol. In other embodiments, the solvent ethanol can be replaced by another solvent capable of dissolving the organic dye C545T. The full name of C545T is 10-(2-Benzothiazolyl)-2,3,6,7-tetrahydro-1,1,7,7-tetramethyl-1H,5H,11H-(1)benzopyropyrano (6,7-8-I,j)quinolizin-11-one.

After that, the solution of C545T and solvent is agitated for 30 min so that C545T is completely dissolved and a light-emitting solution capable of emitting green light is formed. A polymer, such as polyvinylpyrrolidone (PVP), is then added into the above light-emitting solution.

After that, a heating plate is preheated to 60° C. and then used to heat the light-emitting solution. During the heating, the light-emitting solution is agitated until the polyvinylpyrrolidone is completely dissolved.

The light-emitting solution capable of emitting green light is then spin-coated on the target positions (e.g., the first upper surfaces 11a) with a speed between 500 rpm and 9000 rpm for 10 sec.

After that, the substrate 10 is placed under atmosphere, so as to evaporate the solvent from the light-emitting solution and thus gradually form a first conversion film 13 capable of emitting green light. Finally, a protective layer 14 may be coated on the first conversion film 13.

An embodiment of preparing the second conversion film 16 is exemplified below.

Firstly, an organic dye, DCJTB, is dissolved with a proper solvent, e.g., dichloromethane. In other embodiments, the solvent ethanol can be replaced by another solvent capable of dissolving the organic dye DCJTB. The full name of DCJTB is 2-tert-Butyl-4-(dicyanomethylene)-6-[2-(1,1,7,7-tetramethyljulolidin-9-yl)vinyl]-4H-pyran.

After that, the solution of DCJTB and solvent is agitated for 30 min so that DCJTB is completely dissolved and a light-emitting solution capable of emitting red light is formed. A polymer, such as polyvinylpyrrolidone (PVP), is then added into the above light-emitting solution.

After that, a heating plate is preheated to 60° C. and then used to heat the light-emitting solution. During the heating, the light-emitting solution is agitated until the polyvinylpyrrolidone is completely dissolved.

The light-emitting solution capable of emitting red light is then spin coated on the target positions (e.g., the second upper surfaces 11b) with a speed between 500 rpm and 9000 rpm for 10 sec.

After that, the substrate 10 is placed under atmosphere, so as to evaporate the solvent from the light-emitting solution and thus gradually form a second conversion film 16 capable of emitting red light.

Figure 2A:
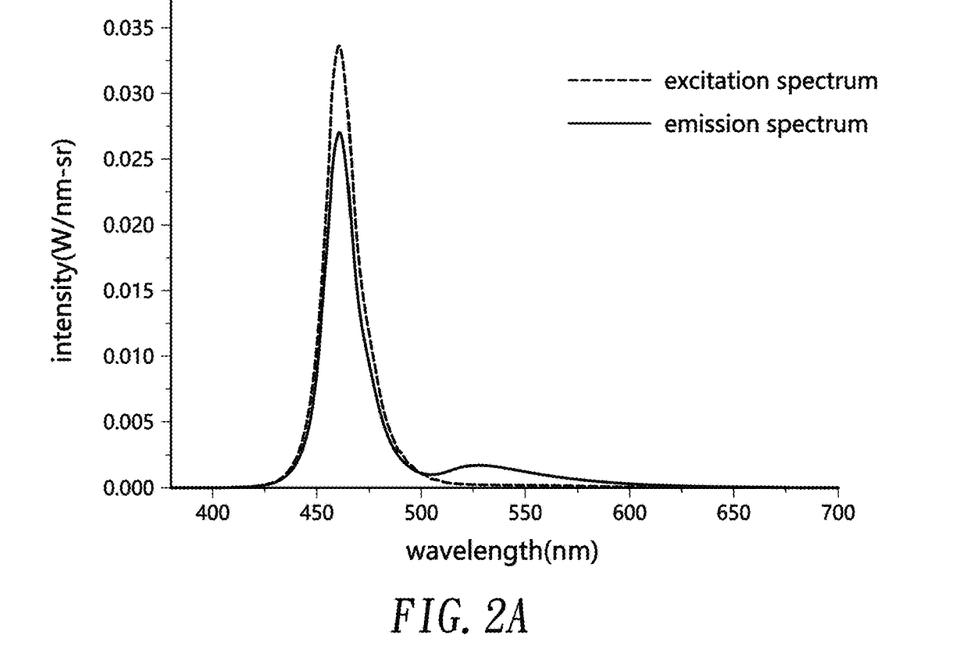
FIGS. 2A and 2B are spectrums of excitation light of an epitaxial layer with a conversion film according to an embodiment of the present invention.
Figure 2B:
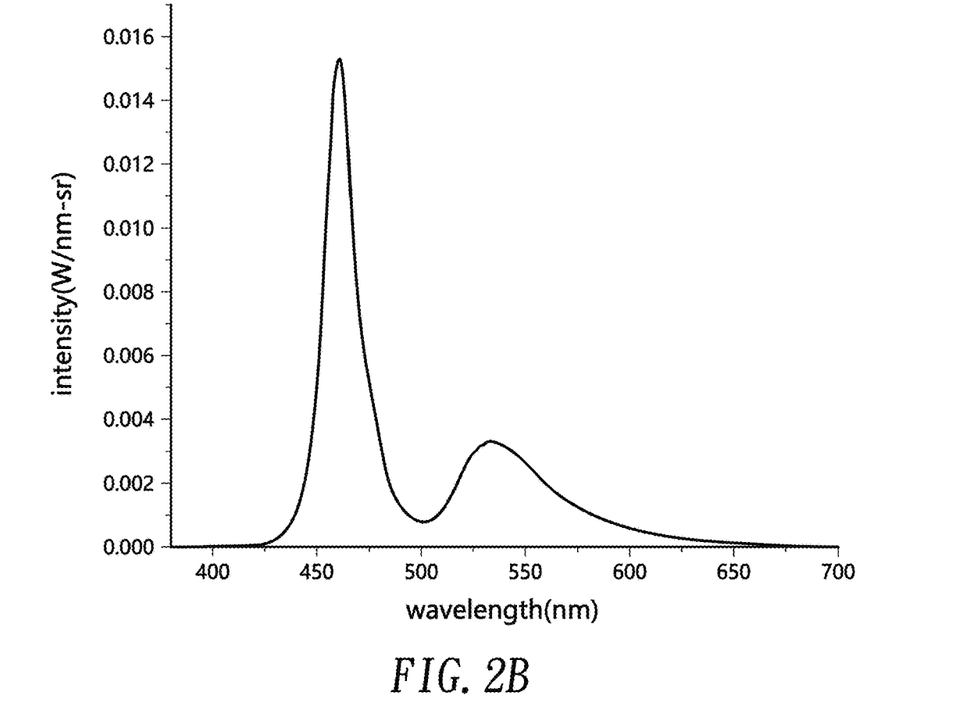

FIG. 2A shows an emission spectrum in which the epitaxial layer emits blue light and a green light excitation spectrum excited by the blue light in the above embodiment. FIG. 2B is the excited green light spectrum in FIG. 2A showing the emission band of the excited light.

Figure 3A:
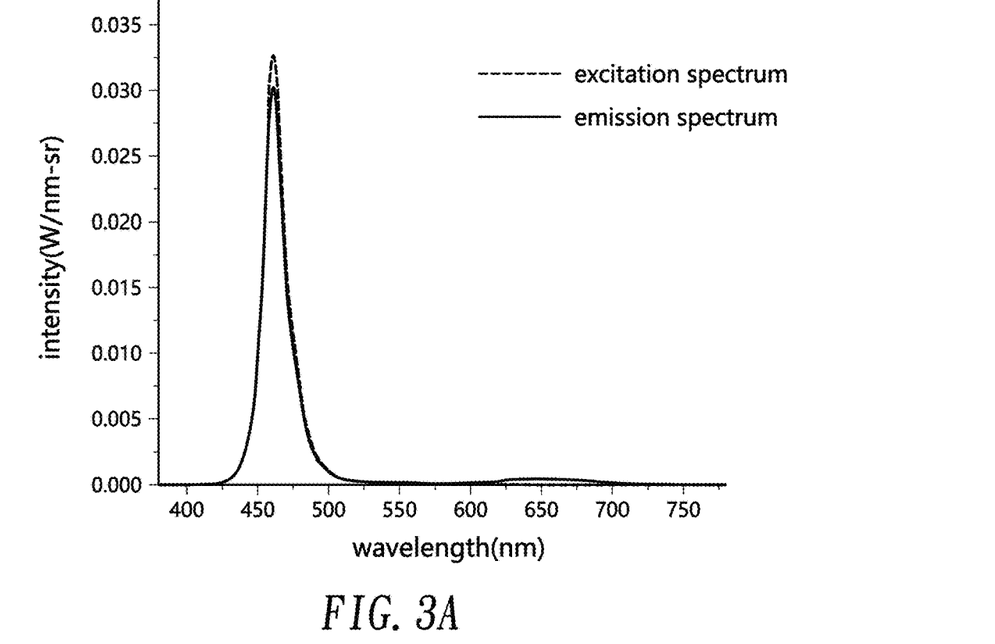
FIGS. 3A and 3B are spectrums of excitation light of an epitaxial layer with a conversion film according to another embodiment of the present invention.
Figure 3B:
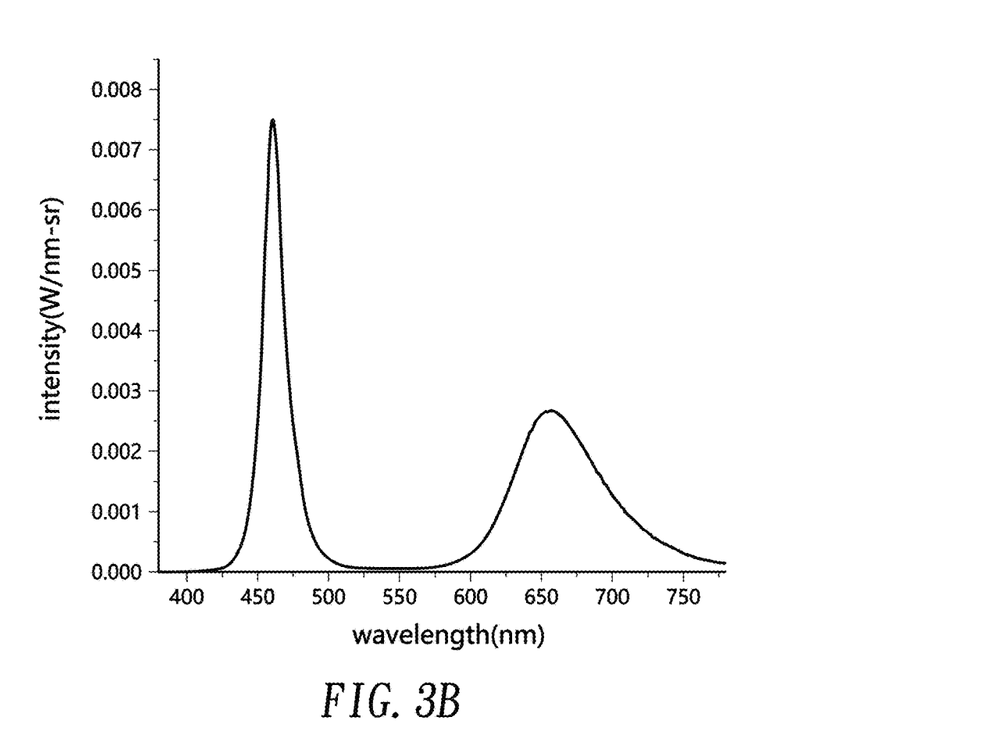

FIG. 3A shows an emission spectrum in which the epitaxial layer emits blue light and a red light excitation spectrum excited by the blue light in the above embodiment. FIG. 3B is the excited red light spectrum in FIG. 3A showing the emission band of the excited light.

Although the conversion films of the above-mentioned embodiment emits a single color light within a wavelength interval, in other embodiments two or more organic dyes may be used so that the produced conversion film can emit two or more color light beams with one or more wavelength intervals.

Figure 4:
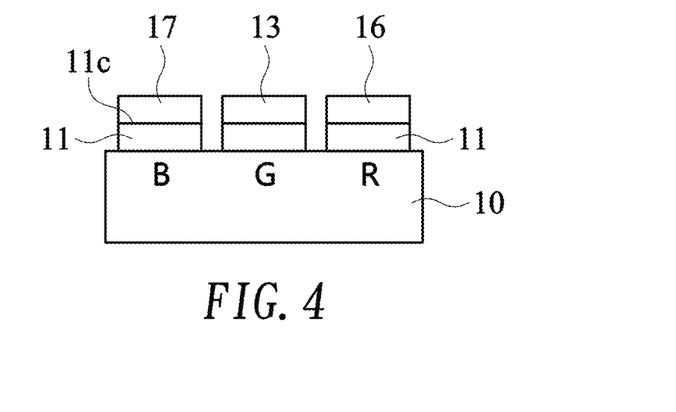
FIG. 4 is a schematic diagram showing a micro light emitting diode array according to another embodiment of the present invention.

A person skilled in the art can make various modifications, substitutions, or alterations to the embodiments shown in FIGS. 1A-1F, and such modifications, substitutions, or alterations are within the scope of the invention. For example, FIG. 4 shows a micro light emitting diode array in accordance with another embodiment of the present invention. In this embodiment, the epitaxial layers 11 emit an ultraviolet light, and the plurality of third conversion films 17 are formed on the plurality of third upper surfaces 11c of the epitaxial layers 11. After absorbing the ultraviolet light, the first, second, and third conversion films respectively emit another color of light, such as a green light, a red light, and a blue light. In another embodiment, a plurality of fourth conversion films (not shown) are further formed on a plurality of fourth upper surfaces (not shown) of the epitaxial layers 11. In one embodiment, the epitaxial layers 11 and/or at least one kind of conversion film may be integrally formed on the substantially whole surface of the substrate 10, and then the integrally formed epitaxial layers 11 and/or the conversion film is patterned by lithography to define pixels.

Figure 5:
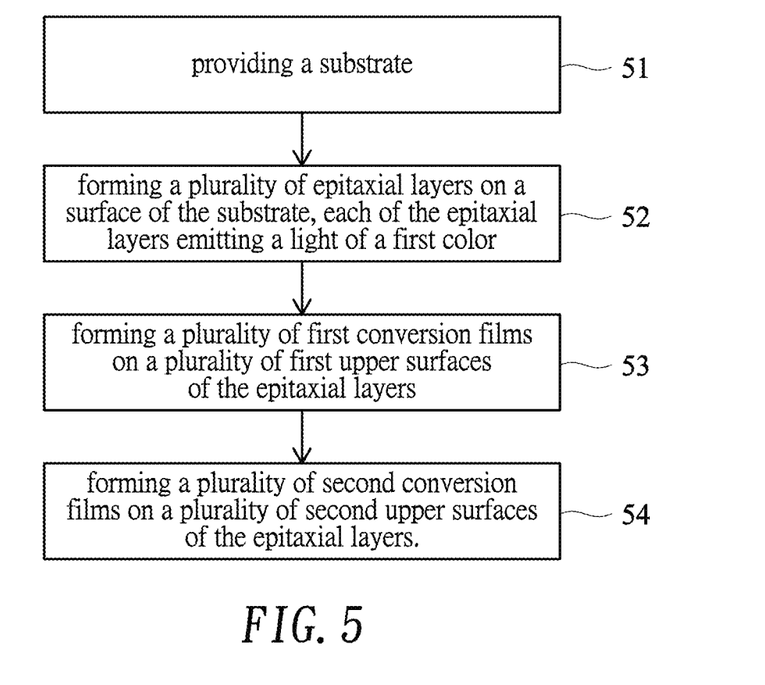
FIG. 5 is a flow chart showing a method of fabricating a micro light emitting diode array according to another embodiment of the present invention.

FIG. 5 is a flow chart showing a method of fabricating a micro light emitting diode array according to another embodiment of the present invention. Referring to FIG. 5, the method includes: step 51, providing a substrate; step 52, forming a plurality of epitaxial layers on a surface of the substrate, each of the epitaxial layers emitting a light of a first color; step 53, forming a plurality of first conversion films on a plurality of first upper surfaces of the epitaxial layers; and step 54, forming a plurality of second conversion films on a plurality of second upper surfaces of the epitaxial layers. A method for forming the plurality of first conversion films or the plurality of second conversion films may comprise the steps of: dissolving one or more organic dyes and a host in a solvent to prepare a light-emitting solution; forming the light-emitting solution on the first upper surfaces or the second upper surfaces; removing the solvent from the light-emitting solution to form the first conversion films or the second conversion films. Wherein, each organic dye absorbs light of the first color and then re-emits a light of another color. In addition, the host eliminates the grain boundaries and light scattering of the one or more organic dyes after the first conversion films or the second conversion films are formed. The order of the described steps in this embodiment can be changed.

Figure 6A:
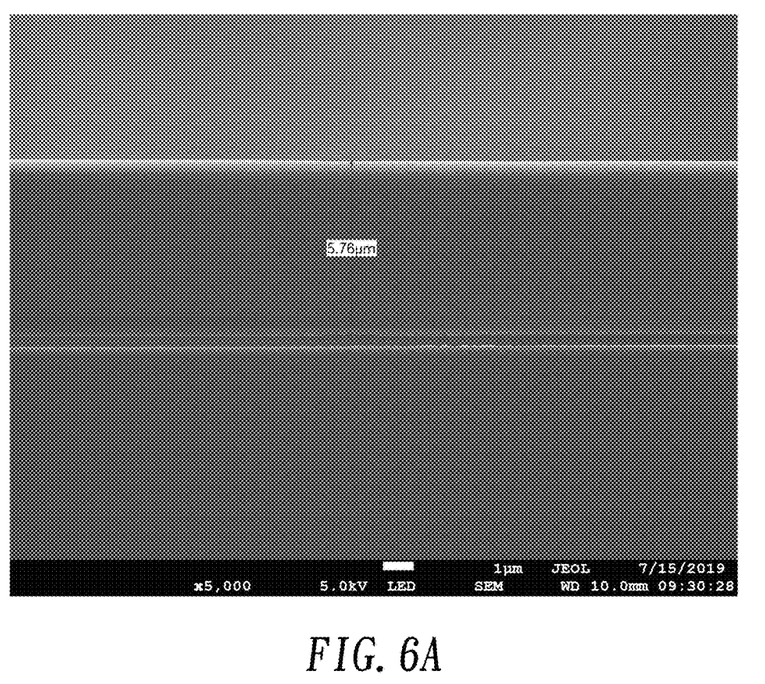
FIG. 6A is a scanning electron micrograph showing a cross-sectional view of a conversion film in accordance with an embodiment of the present invention.
Figure 6B:
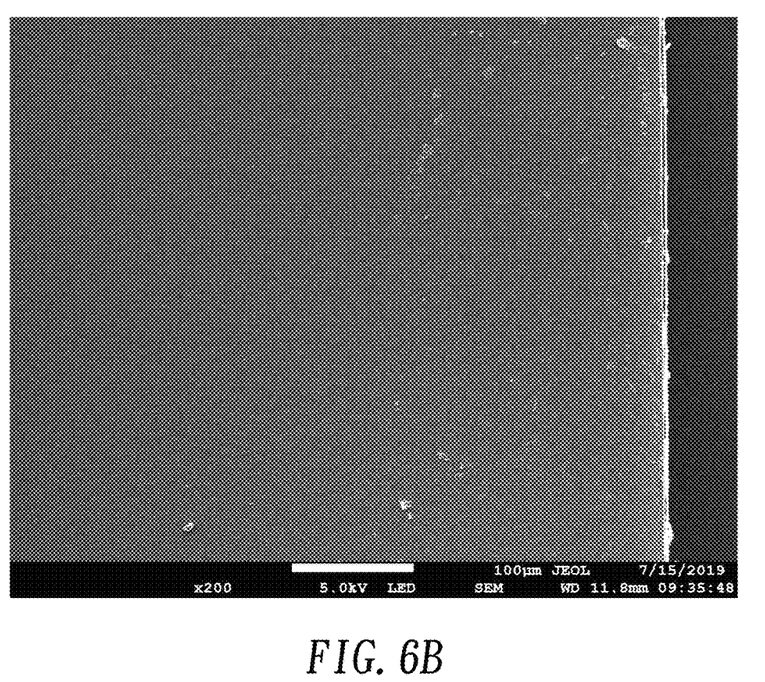
FIG. 6B is a scanning electron micrograph showing a top view of a conversion film in accordance with an embodiment of the present invention.

FIGS. 6A and 6B are scanning electron microscope images showing cross-sectional view and top view of a conversion film (with a thickness 5.76 µm) produced according to an embodiment of the present invention. As shown in FIGS. 6A and 6B, the conversion film produced by the present invention does not have grain boundaries. By contrast, a film formed by conventional fluorescent materials includes grain boundaries. For applications of light emitting diode display, because the formed film includes grain boundaries, the size of pixel cannot be too small. For example, if the average grain size of the fluorescent particles is 10 µm, in order to make the brightness of the individual pixels uniform, it is necessary to increase the number of fluorescent particles per pixel, for example, 100 fluorescent particles per pixel. This will result in a large size of unit pixel, usually greater than 100 µm.

In contrast, each conversion film produced by the present invention is a continuous film because it does not have grain boundaries. Therefore, the size per unit pixel (i.e., the size of the epitaxial layer) is not limited to the average brightness and can be arbitrarily defined. In some embodiments, the size per unit pixel is equal to or less than 15 µm. In some embodiments, the size per unit pixel is equal to or less than 10 µm. In some embodiments, the size per unit pixel ranges from 1 µm to 10 µm. In some embodiments, the size per unit pixel is equal to or less than 5 µm.

Further, because each conversion film of the present invention is a continuous film without grain boundaries, it is possible to define pixels by patterning the conversion film with a conventional lithography. Alternatively, the conversion film of the present invention may be directly formed on the first upper surface, the second upper surface, and/or the third upper surface of the epitaxial layers. Accordingly, the method provided by the present invention does not require a huge amount of transfer and thus can significantly save manufacturing costs.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention. Corresponding or related structure and methods disclosed or referenced herein, and/or in any and all co-pending, abandoned or patented application(s) by any of the named inventor(s) or assignee(s) of this application and invention, are incorporated herein by reference in their entireties, wherein such incorporation includes corresponding or related structure (and modifications thereof) which may be, in whole or in part, (i) operable and/or constructed with, (ii) modified by one skilled in the art to be operable and/or constructed with, and/or (iii) implemented/made/used with or in combination with, any part(s) of the present invention according to this disclosure, that of the application and references cited therein, and the knowledge and judgment of one skilled in the art.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

All of the contents of the preceding documents are incorporated herein by reference in their entireties. Although the disclosure herein refers to certain illustrated embodiments, it is to be understood that these embodiments have been presented by way of example rather than limitation. For example, any of the particulars or features set out or referenced herein, or other features, including method steps and techniques, may be used with any other structure(s) and process described or referenced herein, in whole or in part, in any combination or permutation as a non-equivalent, separate, non-interchangeable aspect of this invention. Corresponding or related structure and methods specifically contemplated and disclosed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the inventive concepts set forth herein and parts thereof, in any permutation and/or combination, include the subject matter of any one or more of the mentioned features and aspects, in any permutation and/or combination.

Although specific embodiments have been illustrated and described, it will be appreciated by those skilled in the art that various modifications may be made without departing from the scope of the present invention, which is intended to be limited solely by the appended claims.

What is claimed is:

1. A method of manufacturing a micro light emitting diode array, comprising the steps of:
   providing a substrate;
   depositing a plurality of epitaxial layers spaced apart from each other and in direct contact with a surface of the substrate, each of the epitaxial layers emitting a light of a first color;
   forming a plurality of first conversion films on a plurality of exposed first upper surfaces of the epitaxial layers, each of the plurality of first conversion films being in direct contact with respective one of the plurality of exposed first upper surfaces;

forming a plurality of second conversion films on a plurality of exposed second upper surfaces of the epitaxial layers, each of the plurality of second conversion films being in direct contact with respective one of the plurality of exposed second upper surfaces;

wherein the steps for forming the plurality of first conversion films and the plurality of second conversion films comprises:

dissolving one or more organic dyes and a host in a solvent to prepare a light-emitting solution;

forming the light-emitting solution on the exposed first upper surfaces or the exposed second upper surfaces;

removing the solvent from the light-emitting solution to form the first conversion films or the second conversion films;

wherein each of the organic dyes absorbs the light of the first color and then re-emits a light of a second color or a light of a third color, and the host eliminates grain boundaries and light scattering of the one or more organic dyes after the first conversion films or the second conversion films are formed.

2. The method as recited in claim 1, wherein each of the epitaxial layers defines a pixel having a size equal to or less than 15 μm.

3. The method as recited in claim 1, wherein each of the epitaxial layers defines a pixel having a size equal to or less than 10 μm.

4. The method as recited in claim 1, wherein the host comprises a polymer.

5. The method as recited in claim 4, wherein the solvent comprises ethanol, chloroform, dichloromethane, or other solvents capable of dissolving the one or more organic dyes and the polymer.

6. The method as recited in claim 1, wherein the organic dyes comprise non-rare earth elements.

7. The method as recited in claim 1, where the step for forming the light-emitting solution on the first upper surfaces or the second upper surfaces is performed by spin coating, dip coating, ink jet printing, screen printing, comma coating, or roll coating.

* * * * *